United States Patent
Fukunaga (10) Patent No.: US 7,205,880 B2
(45) Date of Patent: Apr. 17, 2007

(54) TRIMMER IMPEDANCE COMPONENT, SEMICONDUCTOR DEVICE AND TRIMMING METHOD

(75) Inventor: Naoki Fukunaga, Kyoto (JP)

(73) Assignee: Sharp Kabushiki Kaisha, Osaka (JP)

( * ) Notice: Subject to any disclaimer, the term of this patent is extended or adjusted under 35 U.S.C. 154(b) by 182 days.

(21) Appl. No.: 10/994,601

(22) Filed: Nov. 23, 2004

(65) Prior Publication Data

US 2005/0110608 A1    May 26, 2005

(30) Foreign Application Priority Data

Nov. 25, 2003    (JP)    ............ P 2003-393817

(51) Int. Cl.
*H01C 10/00*    (2006.01)
(52) U.S. Cl. ...................... 338/195; 338/203
(58) Field of Classification Search ........... 338/22 SD, 338/195, 203, 320; 219/121.68; 29/620
See application file for complete search history.

(56) References Cited

U.S. PATENT DOCUMENTS

| | | | | |
|---|---|---|---|---|
| 3,959,732 A | * | 5/1976 | Schaefer | ............ 327/350 |
| 4,150,366 A | * | 4/1979 | Price | ............ 338/195 |
| 4,338,590 A | * | 7/1982 | Connolly et al. | ............ 338/195 |
| 4,906,966 A | * | 3/1990 | Imamura et al. | ............ 338/195 |
| 5,363,084 A | * | 11/1994 | Swinehart | ............ 338/308 |
| 5,757,264 A | * | 5/1998 | Petit | ............ 338/195 |

FOREIGN PATENT DOCUMENTS

| JP | 9-331021 | 12/1997 |
|---|---|---|
| JP | 11-338560 | 12/1999 |

* cited by examiner

*Primary Examiner*—Tu Hoang
(74) *Attorney, Agent, or Firm*—Nixon & Vanderhye P.C.

(57) ABSTRACT

A trimmer resistance component of the present invention has a trimmer resistor constructed of a p-type diffusion layer formed on the surface of an n-type epitaxial layer. A first electrode is connected to a portion located on one end side of this trimmer resistor, while a first connection portion, a second connection portion and a third connection portion of the second electrode are connected to portions located on the other end side. By cutting a portion of the first connection portion and a portion of the second connection portion by laser trimming, a resistance value between the first electrode and the second electrode can be trimmed without changing a parasitic capacitance between the trimmer resistor and the n-type epitaxial layer.

15 Claims, 3 Drawing Sheets

TRIMMER IMPEDANCE COMPONENT, SEMICONDUCTOR DEVICE AND TRIMMING METHOD

This Nonprovisional application claims priority under 35 U.S.C. §119(a) on Patent Application No. 2003-393817 filed in Japan on Nov. 25, 2003, the entire contents of which are hereby incorporated by reference.

BACKGROUND OF THE INVENTION

This invention relates to a trimmer impedance component, a semiconductor device and a trimming method and relates, in particular, to a semiconductor device with a built-in high-speed element as one example and laser trimming that is a trimming method for obtaining a high-accuracy resistance value.

In general, the resistance value of a resistor formed through semiconductor processes disadvantageously has its absolute value varied by about ±10% due to the influences of variations in processing heat treatment, variations in the implantation energy and dosage during ion implantation and variations in processing dimensions (particularly linewidth) attributed to a photoetching process.

The variations in the resistance value of the resistor disadvantageously directly influence the output voltage and so on of the semiconductor device. Therefore, in the semiconductor device that requires a high-accuracy output voltage, trimming is carried out so that the resistor comes to have the desired resistance value by zener-zap trimming, metal-fuse trimming or laser trimming.

Conventionally, with regard to a semiconductor integrated circuit, a technique for providing a built-in trimming circuit employing a component such as a fuse component programmable after manufacturing so as to enable the adjustment of the generated voltage of a constant-voltage power supply circuit or the like internally provided.

The conventional trimming circuit has had a system in which the trimming has been unidirectionally carried out from a low voltage to a high voltage or from a high voltage to a low voltage. Therefore, even in the presence of processing variations, the trimming has been carried out by providing a design such that the generated voltage has become surely higher (or lower) than the expected value in a non-trimmed state and determining the fuse component that should be cut in the trimming circuit according to the amount of deviation from the expected value by measuring the generated voltage after the manufacturing.

Therefore, almost all the semiconductor integrated circuit products provided with constant-voltage power supply circuits capable of adjusting the generated voltage have been subjected to trimming, and the trimming cannot be recovered once the trimming is carried out. For the about reasons, there is a concern that the product might be defective through the re-measurement after the trimming. In order to avoid this occurrence, a method for making a gradual approach to the expected value by repeating the measurement and trimming again and again cannot help being taken, and time required for the trimming has been long.

Figure 5:
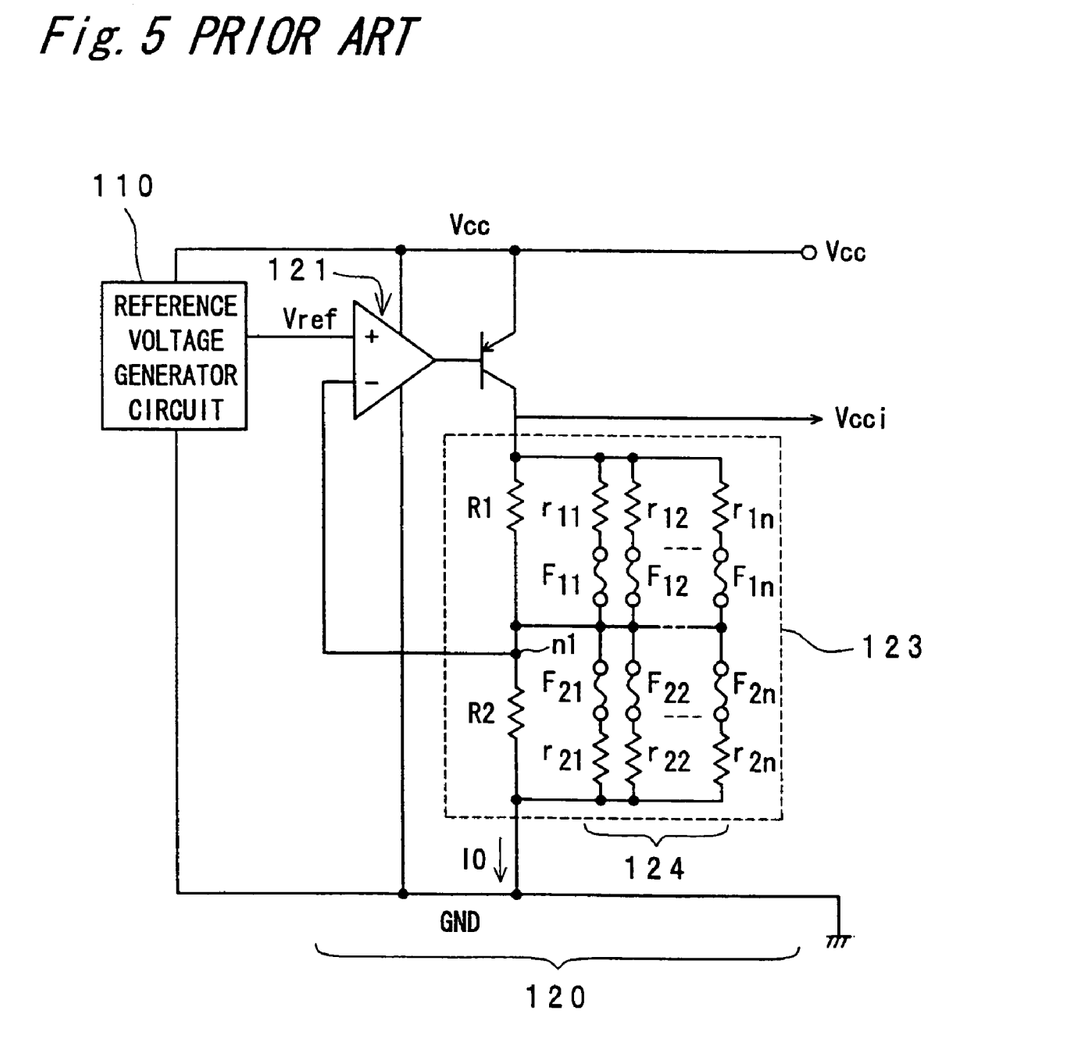
FIG. 5 is a circuit diagram of a conventional semiconductor device.

Accordingly, in order to cope with this, a technique described in, for example, JP 11-338560 A is proposed. For example, as shown in FIG. 5, a differential amplifier circuit (operational amplifier) 121 is employed as a non-inverted amplifier circuit in a constant-voltage power supply circuit 120 provided in a semiconductor integrated circuit, and a reference voltage Vref from a reference voltage generator circuit 110 is applied to the non-inverted input terminal of the operational amplifier 121. Moreover, a voltage obtained by dividing the output voltage by means of resistors is fed back from a resistance divider circuit 123 to the inverted input terminal of the operational amplifier 121.

This resistance divider circuit 123 has resistance dividing resistors R1 and R2 connected in series and a trimming circuit 124. This trimming circuit 124 enables the adjustment of the generated voltage by having a constitution that a plurality of paired trimmer components, each of which consists of trimmer resistor r11 and program component or switching component such as fuse component F11 connected in series, are connected parallel to each of the resistance dividing resistors R1 and R2. According to this trimming circuit 124, the generated voltage can be adjusted in either the direction in which the voltage is raised or the direction in which the voltage is lowered.

The trimmer resistor for trimming the generated voltage of the constant-voltage power supply circuit 120 or the like has often been applied to a portion through which a high-frequency signal does not pass. That is, the trimming circuit 124, which employs the trimmer resistors, has merely adjusted the generated voltage with regard to the DC (direct current) characteristic by trimming with resistors and has not taken the high-frequency characteristics (AC characteristics) of the trimmer resistors and the fuse components into consideration. For example, in the aforementioned semiconductor integrated circuit, a p-type diffusion layer formed on an n-type epitaxial layer is cut, so that a parasitic capacitance between the n-type epitaxial layer and the p-type diffusion layer (trimmer resistors) changes depending on the portion trimmed, and the characteristics to the high-frequency signal change, disadvantageously causing a harmful influence of, for example, phase shift.

SUMMARY OF THE INVENTION

Accordingly, the object of the present invention is to provide a trimmer impedance component capable of preventing the parasitic impedance between the component and a semiconductor layer from changing when impedance is trimmed and obtaining the desired impedance value even to a high-frequency signal.

In order to solve the aforementioned object, the trimmer impedance component of the present invention comprises:

a trimmer impedancer formed on a semiconductor layer;

a first electrode connected to one end side of the trimmer impedancer; and a second electrode connected to the other end side of the trimmer impedancer, wherein at least one of the first electrode and the second electrode comprises a plurality of connection portions connected to different portions of the trimmer impedancer.

According to this invention, the connection position of the first electrode or the second electrode to the trimmer impedancer is changed by cutting any one of the plurality of connection portions, and this allows the impedance between the first electrode and the second electrode to be trimmed. In this case, the parasitic impedance between the trimmer impedancer and the semiconductor layer does not change even if the connection portion is cut, and therefore, a trimmer impedance component capable of accurately trimming impedance even to a high-frequency signal can be provided.

Moreover, in the trimmer impedance component of one embodiment, the trimmer impedancer is a trimmer resistor.

In the trimmer impedance component of this embodiment, the connection position of the first electrode or the second electrode to the trimmer resistor is changed by cutting any one of the plurality of connection portions, and this allows the resistance value between the first electrode and the second electrode to be trimmed. In this case, the parasitic capacitance between the trimmer resistor and the semiconductor layer does not change even if the connection portion is cut, and therefore, a trimmer resistance component capable of accurately trimming the resistance value even to a high-frequency signal can be provided.

Moreover, a semiconductor device of one embodiment comprises a high-frequency circuit including the trimmer impedance component.

In the semiconductor device of this embodiment, the high-frequency circuit has the trimmer impedance component capable of accurately trimming impedance even to a high-frequency signal, and therefore, stable high-frequency operation can be achieved.

Moreover, in the trimmer impedance component of one embodiment, the component comprises a monitor resistor for measuring a resistance value of the trimmer resistor, and the monitor resistor is arranged adjacent to the trimmer resistor.

In the trimmer impedance component of this embodiment, the monitor resistor for measuring the resistance value of the trimmer resistor is arranged adjacent to the trimmer resistor. Therefore, even if the resistance of the trimmer resistor itself is not measured, the resistance value of the trimmer resistor can be comprehended by measuring the resistance value of the monitor resistor. Accordingly, there is no need to connect a resistance measuring pad, which causes a parasitic capacitance, to the trimmer resistor, and it is only required to connect the resistance measuring pad to the monitor resistor. Therefore, the resistance value of the trimmer impedance component can be more accurately trimmed after comprehending the resistance value of the trimmer resistor without adding any extra parasitic capacitance attributed to the resistance measuring pad to the trimmer resistor. This embodiment is suitable for constituting a resistor through which a high-frequency signal passes like the feedback resistor of an amplifier circuit (for example, an operational amplifier). In the operational amplifier, the amplification factor is determined by the absolute value of the feedback resistor.

Moreover, in the trimmer impedance component of one embodiment, the component comprises a plurality of the trimmer resistors and a plurality of the monitor resistors, and the trimmer resistors and the monitor resistors are alternately adjacently arranged.

In the trimmer impedance component of this embodiment, the trimmer resistor and the monitor resistor are alternately adjacently arranged, and therefore, the resistance value of the trimmer resistor can be more accurately comprehended.

Moreover, in the trimmer impedance component of one embodiment, the monitor resistor has a configuration identical to a configuration of the trimmer resistor.

In the trimmer impedance component of this embodiment, the configuration of the monitor resistor is identical to the configuration of the trimmer resistor. Therefore, the resistance value of the trimmer resistor can be more accurately simulated with the monitor resistor, and the resistance value of the trimmer resistor can be still more accurately comprehended.

Moreover, in the trimmer impedance component of one embodiment, the monitor resistor has a linewidth equal to a linewidth of the trimmer resistor.

In the trimmer impedance component of this embodiment, the linewidth of the monitor resistor is the same as the linewidth of the trimmer resistor. Therefore, the resistance value of the trimmer resistor can be more accurately simulated with the monitor resistor, and the resistance value of the trimmer resistor can be still more accurately comprehended.

Moreover, in a semiconductor device of one embodiment having the trimmer impedance component, each of the trimmer resistor and the monitor resistor consists of a p-type diffusion layer formed on an n-type epitaxial layer, and a reverse bias voltage applied to the n-type epitaxial layer corresponding to the trimmer resistor is made equal to a reverse bias voltage applied to the n-type epitaxial layer corresponding to the monitor resistor.

In the semiconductor device of this embodiment, the depletion layer of the pn junction between the p-type diffusion layer that constitutes the monitor resistor and the n-type epitaxial layer can be almost the same as the depletion layer of the pn junction between the p-type diffusion layer that constitutes the trimmer resistor and the n-type epitaxial layer. With this arrangement, the resistance value of the trimmer resistor can be more accurately simulated with the monitor resistor.

Moreover, in the trimmer impedance component of one embodiment, the connection portion is extended parallel to a direction in which the trimmer resistor is extended and arranged on the trimmer resistor.

In the trimmer impedance component of this embodiment, whose area on the semiconductor layer can be reduced by virtue of the connection portion arranged on the trimmer resistor.

Moreover, in the trimmer impedance component of one embodiment, the connection portion is extended parallel to a direction in which the trimmer resistor is extended and arranged adjacent to the trimmer resistor.

In this embodiment, the connection portion is arranged adjacent to the trimmer resistor. Therefore, a concern that the trimmer resistor might be damaged can be eliminated when, for example, the connection portion is cut by laser trimming.

Moreover, in the trimmer impedance component of one embodiment, the trimmer resistor is a polysilicon resistor.

In the trimmer impedance component of this embodiment, the trimmer resistor is a polysilicon resistor. Therefore, this arrangement has advantages that the parasitic capacitance is smaller and the temperature coefficient is also smaller in comparison with those of the diffused resistor.

Moreover, in the trimmer impedance component of one embodiment, the trimmer impedancer is a trimmer capacitor.

In the trimmer impedance component of this embodiment, the trimmer impedancer is a trimmer capacitor.

Therefore, the connection position of the first electrode or the second electrode to the trimmer capacitor is changed by cutting any one of the plurality of connection portions, and the capacitance value between the first electrode and the second electrode can be trimmed. In this case, the parasitic capacitance between the trimmer capacitor and the semiconductor layer does not change even if the connection portion is cut, and therefore, a trimmer capacitance component capable of accurately trimming the capacitance value even to a high-frequency signal can be provided.

Moreover, a trimming method of one embodiment trims an impedance value between the first electrode and the second electrode of the trimmer impedance component by laser trimming for applying laser to the connection portion owned by the trimmer impedance component.

According to the trimming method of this embodiment, the impedance value between the first electrode and the second electrode of the trimmer impedance component can be trimmed by laser trimming.

Moreover, a trimming method of one embodiment comprises the steps of:

measuring a resistance value of the monitor resistor owned by the trimmer impedance component;

selecting a connection portion to which laser is to be applied from among the plurality of connection portions owned by the trimmer impedance component on the basis of the measured resistance value; and trimming an impedance value between the first electrode and the second electrode of the trimmer impedance component by applying laser to the selected connection portion.

According to the trimming method of this embodiment, the resistance value of the monitor resistor is measured, and the connection portion to which the laser is to be applied is selected from among the plurality of connection portions owned by the trimmer impedance component on the basis of this measured resistance value. Accordingly, there is no need to connect a resistance measuring pad, which causes a parasitic capacitance, to the trimmer resistor, and it is only required to connect the resistance measuring pad to the monitor resistor. Therefore, the resistance value of the trimmer impedance component can be more accurately trimmed after comprehending the resistance value of the trimmer resistor without adding any extra parasitic capacitance attributed to the resistance measuring pad to the trimmer resistor.

Moreover, in the trimming method of one embodiment, the step of selecting the connection portion comprises selection of a connection portion to which laser is to be applied from among the plurality of connection portions owned by the trimmer impedance component on the basis of a resistance value obtained by subtracting a resistance value of a metal wiring connected to the monitor resistor from the measured resistance value.

According to the trimming method of this embodiment, the connection portion to which the laser is to be applied is selected on the basis of the resistance value obtained by subtracting the resistance value of the metal wiring from the resistance value of the measured monitor resistor. Therefore, the connection portion to which the laser is to be applied is selected on the basis of the more accurate resistance value of the monitor resistor, namely, on the basis of the resistance value obtained by more accurately simulating the resistance value of the trimmer resistor. Therefore, the resistance value of the trimmer impedance component can be more accurately trimmed.

An optical transmission system of one embodiment comprises the trimmer impedance component.

According to the optical transmission system of this embodiment, there can be obtained an optical transmission system, in which the impedance even to a high-frequency signal can be accurately trimmed, and the operation to the high-frequency signal is accurate and stable.

An optical pickup system of one embodiment comprises the trimmer impedance component.

According to the optical pickup system of this embodiment, there can be obtained an optical pickup system, in which the impedance even to a high-frequency signal can be accurately trimmed, and the operation to the high-frequency signal is accurate and stable.

According to the trimmer impedance component of this invention, the connection position of the first electrode or the second electrode to the trimmer impedancer is changed by cutting any one of the plurality of connection portions of the first electrode or the second electrode, and this allows the impedance between the first electrode and the second electrode can be trimmed. In this case, the parasitic impedance between the trimmer impedancer and the semiconductor layer does not change even if the connection portion is cut, and therefore, a trimmer impedance component capable of accurately trimming the impedance even to the high-frequency signal can be provided.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

This invention will be described in detail below on the basis of the embodiments shown in the drawings.

(The First Embodiment)

Figure 1A:
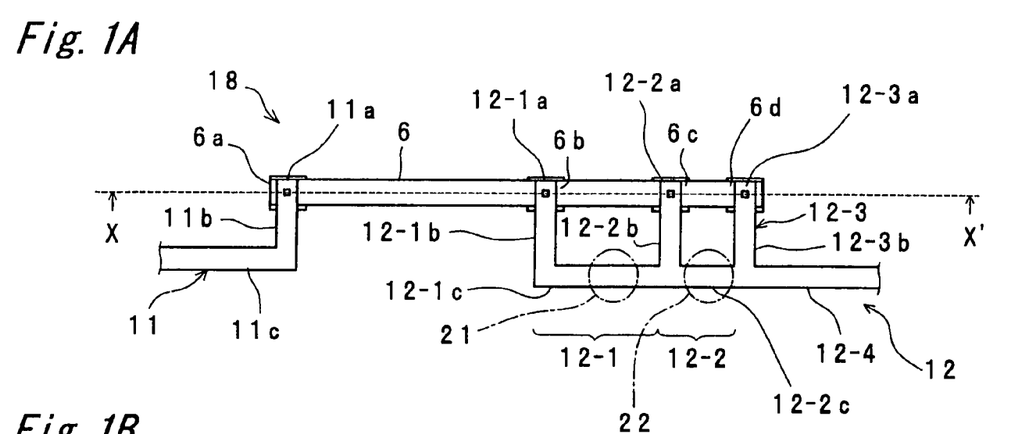
FIG. 1A is a plan view of the essential portion of a first embodiment of a semiconductor device provided with a trimmer resistance component 18 as the trimmer impedance component of this invention.
Figure 1B:
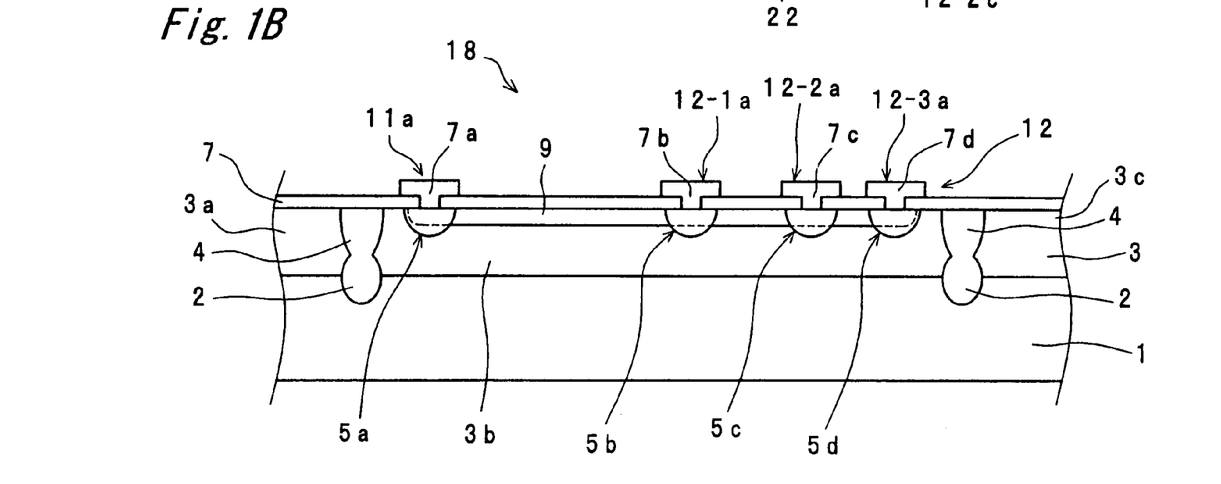
FIG. 1B is a sectional view taken along the line X–X' in FIG. 1A.

A semiconductor device including the trimmer impedance component of this invention will be described as the first embodiment with reference to FIGS. 1A and 1B. FIG. 1B is a sectional view taken along the line X–X' in FIG. 1A.

The manufacturing method of the semiconductor device of this first embodiment is now described. First of all, a p-type embedded diffusion layer 2 for element isolation is formed on the surface of a p-type semiconductor substrate 1. Next, an n-type epitaxial layer 3 is formed on the entire surface of the p-type semiconductor substrate 1, and a p-type isolated diffusion layer 4 is formed in a portion corresponding to the p-type embedded diffusion layer 2 from the surface of the n-type epitaxial layer 3. As a result, the n-type epitaxial layer 3 is electrically divided into a plurality of portions, so that the active components of transistors or the passive components of diffused resistors and capacitors are formed at the respective islands 3a, 3b and 3c of the n-type epitaxial layer 3.

A trimmer resistance component 18 is formed as a trimmer impedance component in one island 3b of the islands 3a through 3c of this n-type epitaxial layer 3. This trimmer resistance component 18 constitutes a feedback resistor of an operational amplifier (not shown) as one example.

After the p-type isolated diffusion layer 4 is formed, a p-type diffusion layer 9 having a high resistance is formed on the surface of the n-type epitaxial layer 3 by ion implantation or the like. This p-type diffusion layer 9 having a high resistance constitutes a trimmer resistor 6 as the trimmer impedancer.

Then, p-type diffusion layers 5a, 5b, 5c and 5d having a comparatively high impurity concentration (low resistance) are formed in this p-type diffusion layer 9.

Further, an SiO$_2$ film 7, which becomes a protective film, or the like is formed on the surface of the n-type epitaxial layer 3, and contact windows 7a, 7b, 7c and 7d are formed in portions corresponding to the p-type diffusion layers 5a, 5b, 5c and 5d. The first electrode 11 and the second electrode 12 are formed by the sputtering method or the like, so that the structure shown in FIG. 1B is obtained. The first electrode 11 and the second electrode 12, which are each provided by a metal wiring, may be provided by a wiring constructed of polysilicon.

As shown in FIG. 1B, an end portion 11a of the first electrode 11 is formed on the p-type diffusion layer 5a. Moreover, an end portion 12-1a of a first connection portion 12-1, an end portion 12-2a of a second connection portion 12-2 and an end portion 12-3a of a third connection portion 12-3 of the second electrode 12 are formed on the p-type diffusion layers 5b, 5c and 5d, respectively. With this arrangement, the first electrode 11 is brought in ohmic connection with the p-type diffusion layer 5a at the end portion 11a, while the first connection portion 12-1, the second connection portion 12-2 and the third connection portion 12-3 of the second electrode 12 are brought in ohmic connection with the p-type diffusion layers 5b, 5c and 5d, respectively, at the end portions 12-1a, 12-2a and 12-3a.

Through the above processes, the semiconductor device of the first embodiment, which has the trimmer resistance component 18 as the trimmer impedance component, is fabricated. As shown in FIG. 1B, this trimmer resistance component 18 has a linearly elongated trimmer resistor 6 constructed of the p-type diffusion layer 9. The end portion 11a of the first electrode 11 is connected to the portion 6a located on one side of this trimmer resistor 6. Moreover, the end portion 12-1a of the first connection portion 12-1, the end portion 12-2a of the second connection portion 12-2 and the end portion 12-3a of the third connection portion 12-3 of the second electrode 12 are connected to the three different portions 6b, 6c and 6d, respectively, on the other end side of the trimmer resistor 6.

The first electrode 11 has a perpendicularly intersecting portion 11b extended in a direction perpendicular to the lengthwise direction of the trimmer resistor 6 from its end portion 11a and a parallel portion 11c extended parallel to the lengthwise direction.

The first connection portion 12-1 of the second electrode 12 has a perpendicularly intersecting portion 12-1b extended in the direction perpendicular to the lengthwise direction from its end portion 12-1a and a parallel portion 12-1c parallel to the lengthwise direction. The second connection portion 12-2 has a perpendicularly intersecting portion 12-2b extended in the direction perpendicular to the lengthwise direction from the its end portion 12-2a and a parallel portion 12-2c parallel to the lengthwise direction.

Moreover, the third connection portion 12-3 of the second electrode 12 has a perpendicularly intersecting portion 12-3b extended in the direction perpendicular to the lengthwise direction from the its end portion 12-3a. This third connection portion 12-3 extends to the parallel portion 12-4 of the second electrode 12.

The parallel portion 12-1c of the first connection portion 12-1 extends to the parallel portion 12-2c of the second connection portion 12-2. The parallel portion 12-2c of the second connection portion 12-2 extends to the parallel portion 12-4.

At the trimmer resistance component 18, by cutting a portion 21 enclosed by the one-dot chain line of the parallel portion 12-1c of the first connection portion 12-1 of the second electrode 12 by laser trimming for applying laser to the portion 21, the resistance value between the first electrode 11 and the parallel portion 12-1 of the second electrode 12 can be increased. Moreover, by cutting a portion 22 enclosed by the one-dot chain line of the parallel portion 12-2c of the second connection portion 12-2 of the second electrode 12 by laser trimming for applying laser to the portion 22, the above-mentioned resistance value can be further increased.

Figure 2:
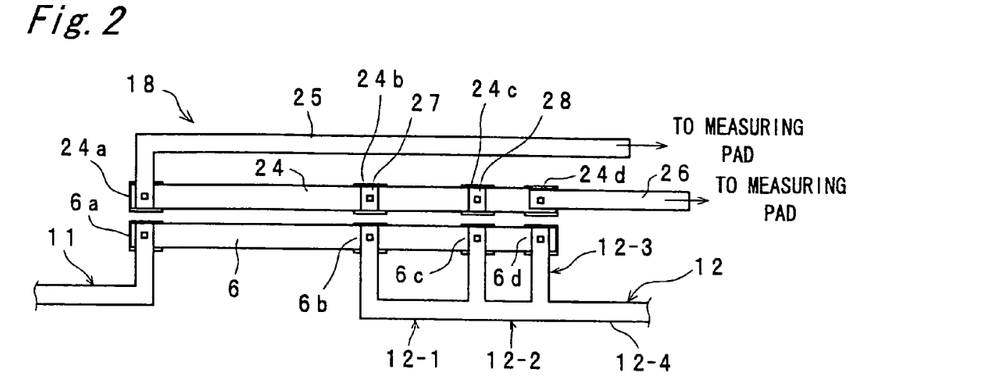
FIG. 2 is a plan view showing overall the trimmer resistance component 18 provided for the first embodiment.

As shown in FIG. 2, the semiconductor device of this embodiment is provided with a monitor resistor 24 located adjacent to the trimmer resistance component 18. This monitor resistor 24 is constructed of the p-type diffusion layer 9 similarly to the trimmer resistor 6, and this p-type diffusion layer 9 is formed in the island 3b of the n-type epitaxial layer 3. This monitor resistor 24 has the same configuration as that of the trimmer resistor 6 and arranged parallel to the trimmer resistor 6. Moreover, a first electrode 25 is connected to one end portion 24a of this monitor resistor 24, and a second electrode 26 is connected to the other end portion 24d.

According to the trimmer resistance component 18, a parasitic capacitance between the trimmer resistor 6 and the island 3b of the n-type epitaxial layer 3 does not change even if the portions 21 and 22 of the connection portions 12-1 and 12-2 are cut. Therefore, a trimmer resistance component 18, which can accurately trim the resistance value even to a high-frequency signal, can be provided.

Moreover, in this monitor resistor 24, a p-type diffusion layer similar to the p-type diffusion layers 5a, 5b, 5c and 5d is formed in lengthwise portions corresponding to the p-type diffusion layers 5a, 5b, 5c and 5d formed at the trimmer resistor 6. Then, a contact window of the SiO$_2$ film 7 of a protective film is formed in a portion corresponding to this p-type diffusion layer, and the first electrode 25 and the second electrode 26 are formed by the sputtering method or the like. Moreover, electrode islands 27 and 28 made of the same material as those of the first and second electrodes 25 and 26 are formed in portions of the p-type diffusion layer formed in portions corresponding to the p-type diffusion layers 5b and 5c formed at the trimmer resistor 6.

The first electrode 25 and the second electrode 26 connected to the monitor resistor 24 are connected to respective measuring pads (not shown), and a resistance value between the end portion 24a and the end portion 24b of the monitor resistor 24 is measured. By this measured resistance value, the resistance value between the end portions 6a and 6d of the trimmer resistor 6 can be comprehended.

Therefore, according to this embodiment, the resistance value of the trimmer resistor 6 can be accurately comprehended by measuring the resistance value of the monitor resistor 24 fabricated through similar processes even when the resistance value of the trimmer resistor 6 is varied by process variations. Therefore, the resistance value of the trimmer resistance component 18 can be appropriately trimmed by the laser trimming.

Moreover, in the semiconductor device of this embodiment, the trimmer resistance component 18 has a high-frequency circuit that constitutes the feedback resistor of the operational amplifier. Therefore, according to this semiconductor device, a high-frequency circuit of which the high-frequency characteristic is satisfactory and the amplification factor is stabilized can be provided by the trimmer resistance component 18 that can accurately trim the resistance value even to a high-frequency signal.

Moreover, according to the semiconductor device of this embodiment, the provision of the monitor resistor 24 obviates the need for providing the trimmer resistor 6 itself with measuring pads that cause a large parasitic capacitance. This arrangement is particularly advantageous in the applications such that a high-frequency signal is made to pass through the trimmer resistor 6 since a concern about the deterioration of the frequency characteristic is removed. That is, a high-frequency circuit (for example, operational amplifier) of which the AC characteristic is satisfactory and the amplification factor is stabilized can be provided.

(The Second Embodiment)

Figure 3:
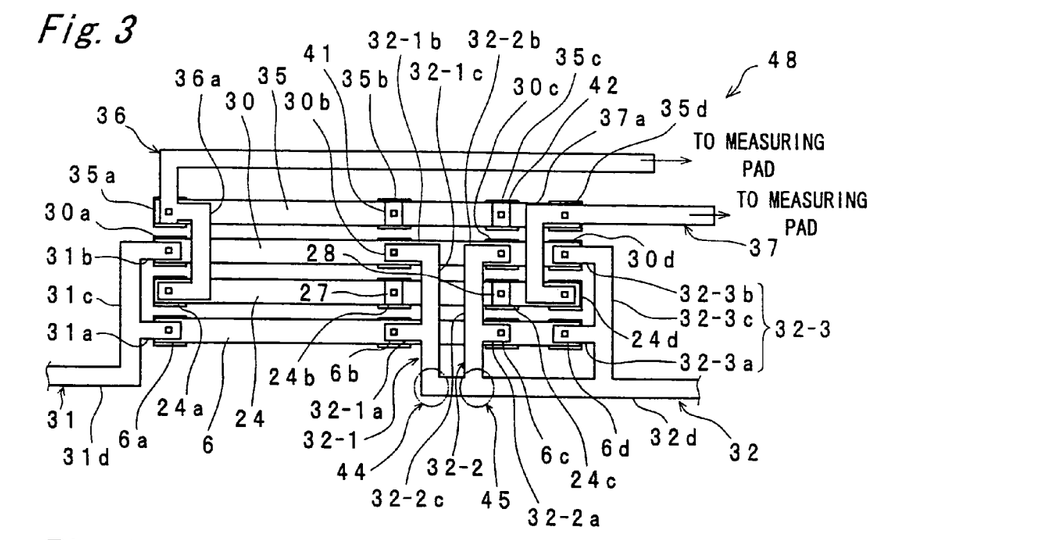
FIG. 3 is a plan view of a second embodiment of a semiconductor device provided with a trimmer resistance component 48 as the trimmer impedance component of this invention.

Next, the second embodiment of the semiconductor device of this invention is shown in FIG. 3. This second embodiment differs from the aforementioned first embodiment in the following points of (i) through (iv).

(i) A trimmer resistance component 48 that has a trimmer resistor 6 and a trimmer resistor 30 is provided in place of the trimmer resistance component 18.

(ii) A first electrode 31 and a second electrode 32 connected to the trimmer resistors 6 and 30 are provided in place of the first electrode 11 and the second electrode 12 connected to the trimmer resistor 6.

(iii) A monitor resistor 35 is provided in addition to the monitor resistor 24.

(iv) A first electrode 36 and a second electrode 37 connected to the monitor resistors 24 and 35 are provided in place of the first electrode 25 and the second electrode 26 connected to the monitor resistor 24.

This second embodiment is similar to the first embodiment in that the monitor resistor 24 is arranged adjacent to the trimmer resistor 6. In this second embodiment, a trimmer resistor 30 of the same structure as that of the trimmer resistor 6 is arranged adjacent to the monitor resistor 24. Moreover, a monitor resistor 35 of the same structure as that of the monitor resistor 24 is arranged adjacent to this trimmer resistor 30. The trimmer resistors 6 and 30 and the monitor resistors 24 and 35 are arranged alternately parallel to each other with interposition of a prescribed interval.

Portions 6a and 30a located on one end side of the trimmer resistors 6 and 30 are connected to parallel portions 31a and 31b of the first electrode 31. The parallel portions 31a and 31b extend to a perpendicularly intersecting portion 31c, and this perpendicularly intersecting portion 31c extend to a parallel portion 31d.

Moreover, portions 6d and 30d located on the other end side of the trimmer resistors 6 and 30 are connected to parallel portions 32-3a and 32-3b of the third connection portion 32-3 of the second electrode 32. The parallel portions 32-3a and 32-3b extend to a perpendicularly intersecting portion 32-3c, and this perpendicularly intersecting portion 32c extends to a parallel portion 32d.

Moreover, portions 6c and 30c located a prescribed dimension closer to the one end side than the portions 6d and 30d of the trimmer resistors 6 and 30 are connected to parallel portions 32-2a and 32-2b of the second connection portion 32-2 of the second electrode 32. The parallel portions 32-2a and 32-2b extend to a perpendicularly intersecting portion 32-2c, and this perpendicularly intersecting portion 32-2c extends to the parallel portion 32d. Moreover, the portions 6b and 30b located a prescribed dimension closer to the one end side than the portions 6c and 30c of the trimmer resistors 6 and 30 are connected to parallel portions 32-1a and 32-1b of the first connection portion 32-1 of the second electrode 32. The parallel portions 32-1a and 32-1b extend to a perpendicularly intersecting portion 32-1c, and this perpendicularly intersecting portion 32-1c extends to the parallel portion 32d.

On the other hand, portions 24a and 35a located on one end side of the monitor resistors 24 and 35 are connected to each other via a connection portion 36a of the first electrode 36. This connection portion 36a strides over the trimmer resistor 30 and is electrically insulated by the $SiO_2$ film 7 with respect to the trimmer resistor 30. The portions 24a and 35a located on one end side of the monitor resistors 24 and 35 have same positions in the lengthwise direction, and the portions 24a and 35a have same positions in the lengthwise direction as those of the portions 6a and 30a located on one end side of the trimmer resistors 6 and 30.

Moreover, portions 24d and 35d located on the other end side of the monitor resistors 24 and 35 are connected to each other via a connection portion 37a of the second electrode 37. This connection portion 37a strides over the trimmer resistor 30 and is electrically insulated by the $SiO_2$ film 7 with respect to the trimmer resistor 30. The portions 24d and 35d of the monitor resistors 24 and 35 have same positions in the lengthwise direction, and the portions 24d and 35d have same positions in the lengthwise direction as those of the portions 6d and 30d of the trimmer resistors 6 and 30.

Moreover, electrode islands 28 and 42 made of the same material as that of the second electrode 37 are formed in portions 24c and 35c located a prescribed dimension closer to the portions 24a and 35a on the one end side than the portions 24d and 35d on the other end side of the monitor resistors 24 and 35. The electrode islands 28 and 42 and the portions 6c and 30c of the trimmer resistors 6 and 30 have same positions in the lengthwise direction.

Moreover, electrode islands 27 and 41 made of the same material as that of the second electrode 37 are formed in portions 24b and 35b located a prescribed dimension closer to the portions 24a and 35a on one end side than the portions 24c and 35c of the monitor resistors 24 and 35. The electrode islands 27 and 41 and the portions 6b and 30b of the trimmer resistors 6 and 30 have same positions in the lengthwise direction.

In the semiconductor device of this second embodiment, by cutting the connection portion 44 between the perpendicularly intersecting portion 32-1c of the first connection portion 32-1 and the parallel portion 32d of the second electrode 32 connected to the trimmer resistors 6 and 30 of the trimmer resistance component 48 by laser trimming, the resistance value between the first electrode 31 and the second electrode 32 can be increased. Further, by cutting the connection portion 45 between the perpendicularly intersecting portion 32-2c of the second connection portion 32-2 and the parallel portion 32d of the second electrode 32 by laser trimming, the above-mentioned resistance value can be further increased.

Moreover, in the semiconductor device of this second embodiment, the two trimmer resistors 6 and 30 and the two monitor resistors 24 and 35 are alternately adjacently arranged, and therefore, a microloading effect (phenomenon that the etching rate is varied depending on the density of the pattern) in the semiconductor manufacturing processes becomes hard to occur. Therefore, the resistance values of the monitor resistors 24 and 35 and the resistance values of the trimmer resistors 6 and 30 can be more precisely made equal to each other. Therefore, by measuring the resistance value between the first electrode 36 and the second electrode 37 connected to the monitor resistors 24 and 35, the resistance values of the trimmer resistors 6 and 30 can be more accurately comprehended.

Moreover, in the semiconductor device of this second embodiment, the monitor resistors 24 and 35 and the trimmer resistors 6 and 30 are made to have the same configuration, and therefore, the resistors 24, 35, 6 and 30 similarly receive the influence of process variations. Therefore, the resistance values of the trimmer resistors 6 and 30 can be more accurately comprehended by the monitor resistors 24 and 35.

Although it is desirable that the monitor resistors and the trimmer resistors have the same configuration, the resistors may have only the same linewidth. This is because the process variations that exert the most serious influence on the absolute values of the resistors are mainly ascribed to the linewidth variations.

Moreover, it is desirable that the reverse bias applied to the islands of the n-type epitaxial layer 3 in which the monitor resistors 24 and 35 and the trimmer resistors 6 and 30 are formed is identical. The reason for the above is that the depletion layer located in the pn junctions formed by the reverse bias applied to the n-type epitaxial layer 3 expands also to the resistor side due to the fact that the monitor resistors 24 and 35, and the trimmer resistors 6 and 30 are all formed of the p-type diffusion layer 9 and the impurity concentration is comparatively low, and the resistance value of the resistor is changed by the magnitude of this reverse bias.

Therefore, it is desirable that the monitor resistors 24 and 35 and the trimmer resistors 6 and 30 are formed in an identical island of the n-type epitaxial layer 3. Moreover, by making identical the reverse bias applied to the islands even in the case of different islands of the n-type epitaxial layer 3 at the monitor resistors 24 and 35 and the trimmer resistors 6 and 30, it becomes possible to accurately comprehend the resistance values of the trimmer resistors 6 and 30 by measuring the resistance values of the monitor resistors 24 and 35.

Moreover, in the first and second embodiments, the parallel portions 12-1c and 12-2c and the connection portions 44 and 45 to be subjected to the laser trimming were arranged displaced in the widthwise direction from the trimmer resistor 6 in order not to damage the trimmer resistor 6 during the laser trimming. However, it is also acceptable to arrange the connection portions of the electrodes to be subjected to the laser trimming on the trimmer resistor as in the following third embodiment in the case of laser trimming that has no concern about the damage to the trimmer resistor 6.

(The Third Embodiment)

Figure 4:
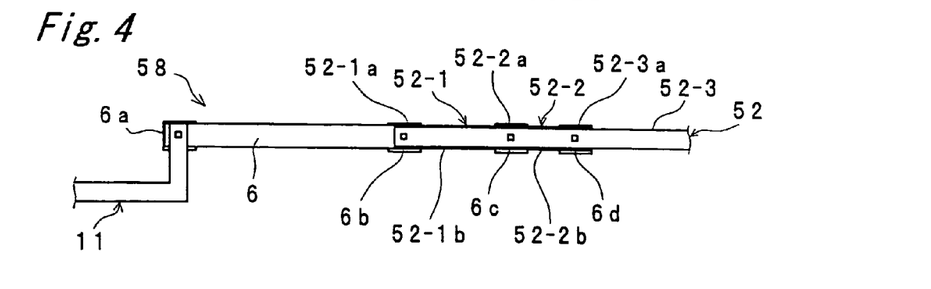
FIG. 4 is a plan view of a third embodiment of a semiconductor device provided with a trimmer resistance component 58 as the trimmer impedance component of this invention.

FIG. 4 shows the third embodiment of the semiconductor device of this invention. This third embodiment differs from the first embodiment in that a trimmer resistance component 58 having a second electrode 52 is provided in place of the second electrode 12.

This second electrode 52 is formed on the trimmer resistor 6. This second electrode 52 has a first connection portion 52-1, a second connection portion 52-2 and a third connection portion 52-3. An end portion 52-1a of this first connection portion 52-1 is connected to the portion 6b of the trimmer resistor 6, and an end portion 52-2a of the second connection portion 52-2 is connected to the portion 6c of the trimmer resistor 6. Moreover, an end portion 52-3a of the third connection portion 52-3 is connected to the portion 6d of the trimmer resistor 6. Moreover, the second electrode 52 is linearly extended in the lengthwise direction, while the first connection portion 52-1, the second connection portion 52-2 and the third connection portion 52-3 linearly extend.

According to this third embodiment, by cutting the portion 52-1b of the first connection portion 52-1 or the portion 52-2b of the second connection portion 52-2 by laser trimming, the resistance value between the first electrode 11 and the second electrode 52 can be trimmed.

Moreover, according to this third embodiment, the second electrode 52 of the trimmer resistance component 58 has been formed on the trimmer resistor 6 via the $SiO_2$ film 7. Therefore, the trimmer resistance component 58 having an area smaller than that of the trimmer resistance component 18 can be provided. It is to be noted that the second electrode 52 may be either a metal wiring or a polysilicon resistor. Furthermore, according to this third embodiment, since the second electrode 52 of the trimmer resistance component 58 exists on the trimmer resistor 6, the parasitic capacitance of the second electrode 52 comes to exist between the electrode and the trimmer resistor 6. In this case, there is an advantage that the parasitic capacitance can be substantially ignored since the trimmer resistor 6 and the second electrode 52 have an identical electrical potential.

Although the trimmer resistor 6 has been the diffused resistor constructed of the p-type diffusion layer 9 in the first through third embodiments, the resistor may be a resistor made of polysilicon. Furthermore, the semiconductor devices of the first through third embodiments are provided with the trimmer resistance components 18, 48 and 58 using the trimmer resistors as the trimmer impedancers. However, it is acceptable to provide a trimmer capacitance component that has a trimmer capacitor in place of the trimmer resistor as the trimmer impedance component.

Moreover, as described in connection with the first and second embodiments, the resistance values of the trimmer resistors 6 and 30 are comprehended by measuring the resistance values of the monitor resistors 24 and 35. In this case, electrodes 25, 26, 36 and 37 for extracting wiring and diffusions 5a, 5b and 5c for electrodes exist in the monitor resistors 24 and 35. Normally, the monitor resistors 24 and 35 and the trimmer resistors 6 and 30 have a high resistance of 1 to 3 k$\Omega$/□, whereas the diffusions 5a through 5c have a low resistance of 100 to 300 $\Omega$/□. As described above, the resistance values of the diffusions 5a through 5c are comparatively small and cause no serious problem even if they are ignored. However, in order to more accurately comprehend the resistance values of the trimmer resistors 6 and 30, it is desirable to execute the calculation operation of subtracting the resistance values due to the diffusions for electrodes from the result of measuring the resistance values of the monitor resistors 24 and 35. Likewise, with regard to the wiring resistances of the electrodes 25, 26, 36 and 37 extended from the monitor resistors 24 and 35 to the measuring pads, it is desirable to comprehend the resistance value of the trimmer resistors 6 and 30 by the value obtained by subtracting this wiring resistance from the result of measuring the resistance values of the monitor resistors 24 and 35. This is because the wiring resistance is the resistance component that does not exist in the trimmer resistors 6 and 30.

Although the semiconductor devices provided with the trimmer resistance components 18, 48 and 58 have been described in connection with the first through third embodiments, it is acceptable to constitute an optical transmission system or an optical pickup system provided with the trimmer resistance component 18, 48 or 58. Moreover, it is acceptable to constitute an optical transmission system or an optical pickup system provided with a trimmer capacitance component in place of the trimmer resistance component. With this arrangement, impedance can be accurately trimmed even to a high-frequency signal. In the case where the trimmer resistance component is used as a feedback resistor, there can be provided an optical transmission system and an optical pickup system provided with a semiconductor device such as an operational amplifier where the operation of the amplification factor and so on with respect to the high-frequency signal is accurate and stable.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A trimmer impedance component comprising:
   a trimmer impedancer formed on a semiconductor layer;
   a first electrode connected to one end side of the trimmer impedancer;
   a second electrode connected to the other end side of the trimmer impedancer, wherein
   at least one of the first electrode and the second electrode comprises a plurality of connection portions connected to different portions of the trimmer impedancer, wherein the trimmer impedancer is a trimmer resistor;
   a monitor resistor for measuring a resistance value of the trimmer resistor, and the monitor resistor is arranged adjacent to the trimmer resistor; and
   wherein the monitor resistor has a configuration identical to a configuration of the trimmer resistor.

2. A trimmer impedance component comprising:
   a trimmer impedancer formed on a semiconductor layer;
   a first electrode connected to one end side of the trimmer impedancer;
   a second electrode connected to the other end side of the trimmer impedancer, wherein
   at least one of the first electrode and the second electrode comprises a plurality of connection portions connected to different portions of the trimmer impedancer, wherein the trimmer impedancer is a trimmer resistor;
   a monitor resistor for measuring a resistance value of the trimmer resistor, and the monitor resistor is arranged adjacent to the trimmer resistor; and
   wherein the monitor resistor has a linewidth equal to a linewidth of the trimmer resistor.

3. A semiconductor device comprising a trimmer impedance component, the trimmer impedance component comprising:
   a trimmer impedancer formed on a semiconductor layer;
   a first electrode connected to one end side of the trimmer impedancer;
   a second electrode connected to the other end side of the trimmer impedancer, wherein
   at least one of the first electrode and the second electrode comprises a plurality of connection portions connected to different portions of the trimmer impedancer, wherein the trimmer impedancer is a trimmer resistor;
   a monitor resistor for measuring a resistance value of the trimmer resistor, and the monitor resistor is arranged adjacent to the trimmer resistor;
   wherein each of the trimmer resistor and the monitor resistor consists of a p-type diffusion layer formed on an n-type epitaxial layer, and
   a reverse bias voltage applied to the n-type epitaxial layer corresponding to the trimmer resistor is made equal to a reverse bias voltage applied to the n-type epitaxial layer corresponding to the monitor resistor.

4. A trimming method comprising the steps of:
   measuring a resistance value of the monitor resistor owned by the trimmer impedance component claimed in claim 1;
   selecting a connection portion to which laser is to be applied from among the plurality of connection portions owned by the trimmer impedance component on the basis of the measured resistance value; and
   trimming an impedance value between the first electrode and the second electrode of the trimmer impedance component by applying laser to the selected connection portion.

5. The trimming method as claimed in claim 4, wherein the step of selecting the connection portion comprises:
   selection of a connection portion to which laser is to be applied from among the plurality of connection portions owned by the trimmer impedance component on the basis of a resistance value obtained by subtracting a resistance value of a metal wiring connected to the monitor resistor from the measured resistance value.

6. An optical transmission system comprising the trimmer impedance component claimed in claim 1.

7. An optical pickup system comprising the trimmer impedance component claimed in claim 1.

8. A semiconductor device comprising a high frequency circuit including the trimmer impedance component of claim 1.

9. A semiconductor device comprising a high frequency circuit including the trimmer impedance component of claim 2.

10. The trimmer impedance component of claim 1, wherein the component comprises a plurality of the trimmer resistors and a plurality of the monitor resistors; and the trimmer resistors and the monitor resistors are alternately adjacently arranged.

11. The trimmer impedance component of claim 2, wherein the component comprises a plurality of the trimmer resistors and a plurality of the monitor resistors; and the trimmer resistors and the monitor resistors are alternately adjacently arranged.

12. A trimming method comprising measuring a resistance value of the monitor resistor of the trimmer impedance component of claim 2, further comprising selecting a connection portion to which laser is to be applied from among the plurality of connection portions of the trimmer impedance component on a basis of the measured resistance value; and trimming an impedance value between the first electrode and the second electrode of the trimmer impedance component by applying laser to the selected connection portion.

13. The method of claim 12, wherein said selecting step comprising selection of a connection portion to which laser is to be applied from among the plurality of connection portions of the trimmer impedance component on a basis of a resistance value obtained by subtracting a resistance value of a metal wiring connected to the monitor resistor from the measured resistance values.

14. An optical transmission system comprising the trimmer impedance component of claim 2.

15. An optical pickup system comprising the trimmer impedance component of claim 2.

* * * * *